United States Patent
Lyon

(10) Patent No.: US 9,055,697 B2
(45) Date of Patent: Jun. 9, 2015

(54) AIR CONDITIONING SYSTEM CONTROL

(75) Inventor: Geoff Sean Lyon, Calgary (CA)

(73) Assignee: COOLIT SYSTEMS, INC., Calgary (CA)

(*) Notice: Subject to any disclaimer, the term of this patent is extended or adjusted under 35 U.S.C. 154(b) by 989 days.

(21) Appl. No.: 12/813,701

(22) Filed: Jun. 11, 2010

(65) Prior Publication Data

US 2010/0286843 A1    Nov. 11, 2010

Related U.S. Application Data

(63) Continuation-in-part of application No. 12/368,205, filed on Feb. 9, 2009, now abandoned.

(60) Provisional application No. 61/219,238, filed on Jun. 22, 2009, provisional application No. 61/027,185, filed on Feb. 8, 2008.

(51) Int. Cl.
*G06F 17/50* (2006.01)
*H05K 7/20* (2006.01)
*G05D 23/19* (2006.01)

(52) U.S. Cl.
CPC ........ *H05K 7/20836* (2013.01); *G05D 23/1932* (2013.01)

(58) Field of Classification Search
CPC ..... G05D 23/19; G06F 15/00; H05K 7/20836
USPC ............................................................ 703/1
See application file for complete search history.

(56) References Cited

U.S. PATENT DOCUMENTS

| | | | |
|---|---|---|---|
| 6,868,682 B2 | 3/2005 | Sharma et al. | |
| 7,051,946 B2 | 5/2006 | Bash et al. | |
| 7,313,461 B2* | 12/2007 | Sharma et al. | 700/245 |
| 7,313,924 B2 | 1/2008 | Bash et al. | |
| 7,630,795 B2 | 12/2009 | Campbell et al. | |
| 7,756,667 B2* | 7/2010 | Hamann et al. | 702/130 |
| 7,995,339 B2 | 8/2011 | Bash et al. | |
| 2004/0008113 A1* | 1/2004 | Pradhan et al. | 340/539.26 |
| 2004/0243280 A1* | 12/2004 | Bash et al. | 700/245 |
| 2006/0168975 A1 | 8/2006 | Malone et al. | |

(Continued)

OTHER PUBLICATIONS

H.F. Harmann, T.G. van Kessal, M. Iyengar, J.-Y. Chung, W. Hirt, M.A. Schappert, A. Classen, J.M. Cook, W. Min, Y. Amermiya, J.A. Lacey, M.O'Boyle, "Uncovering energy-efficientcy opportunities in data centers", IBM 2009, pp. 10:1-10:12.*

(Continued)

*Primary Examiner* — Dwin M Craig
(74) *Attorney, Agent, or Firm* — Ganz Pollard, LLC

(57) ABSTRACT

Systems, devices and methods for generating a virtual mapping of a room are provided. A plurality of racks for housing servers, a plurality of position determining devices and a plurality of temperature sensors can be provided. A computer can be operatively connected to the plurality of position determining devices and the temperature sensors. Each position determining device can be associated with one or more of the temperature sensors. For each of the temperature sensors, position information can be obtained from the position determining device associated with the temperature sensor and the position information used to plot the temperature sensor in a virtual mapping of the room. The virtual mapping can then be used to visually represent a location in the room where a temperature measurement was taken.

19 Claims, 7 Drawing Sheets

(56) References Cited

U.S. PATENT DOCUMENTS

| | | |
|---|---|---|
| 2006/0171538 A1* | 8/2006 | Larson et al. .................. 380/270 |
| 2006/0248159 A1* | 11/2006 | Polan ............................ 709/208 |
| 2007/0032979 A1* | 2/2007 | Hamann et al. ............... 702/130 |
| 2007/0078635 A1* | 4/2007 | Rasmussen et al. .............. 703/1 |
| 2008/0186670 A1 | 8/2008 | Lyon et al. |
| 2009/0199580 A1 | 8/2009 | Lyon |
| 2010/0106464 A1* | 4/2010 | Hlasny et al. ..................... 703/1 |

OTHER PUBLICATIONS

Feng Cui, Minglu Zhang, Lingyu Sun, "Design of GPS/MM/GPRS Integrated Location System for the Mobile Robot" IEEE 2006, 6 pages.*

Cool 'n' Quiet Technology Installation Guide for AMD Athlon 64 Processor Based Systems, Revision 0.04, Advanced Micro Devices, Inc., Jun. 2004.

Data Center Thermal Zone Mapping, Hewlett-Packard Development Company, LP, Ferrer, et al., 4AA1-5481ENW, Sep. 2007.

* cited by examiner

AIR CONDITIONING SYSTEM CONTROL

CROSS REFERENCE TO RELATED APPLICATIONS

This is a continuation-in-part of U.S. application Ser. No. 12/368,205 filed Feb. 9, 2009, U.S. application Ser. No. 12/368,205 and the present application claim priority under 35 USC §119 from U.S. provisional patent application Ser. No. 61/027,185 filed Feb. 8, 2008. This present application also claims priority under 35 USC §119 based on U.S. provisional patent application Ser. No. 61/219,238, filed Jun. 22, 2009.

FIELD

The present invention relates to systems and methods for controlling the temperature of rooms containing computer devices, such as data centers, and more specifically to systems and methods for obtaining measurements of conditions in the room and determining the contribution of various cooling effects.

BACKGROUND OF THE INVENTION

Computer systems and electronics are sensitive to environmental temperatures. At the same time, computer systems and electronics can produce significant amounts of thermal energy. As such, rooms that accommodate large numbers of computer servers, computers or other electronics requiring air conditioning, such as data centers, require sophisticated cooling systems to keep the temperature in the room within the devices operating range. Such air conditioning systems, called computer room air conditioning systems (CRACS), generally include a number of air conditioning inlets to the room.

To cool these rooms, it is common to introduce cooling air flows at a relatively high volume from all inlets. In this way, the entire room is either over cooled or the room is cooled to satisfy the requirements of the hottest devices. However, this practice tends to over cool many of the devices. There are energy usage concerns with such an approach to computer room air conditioning.

SUMMARY OF THE INVENTION

In accordance with a broad aspect of the invention, there is provided a system for generating a virtual mapping of a room containing a plurality of computer servers, the system comprising: a plurality of racks for housing servers; a plurality of position determining devices, each position determining device operative to obtain position information and associated with one of the plurality of racks; a plurality of temperature sensors, each temperature sensor associated with one of the position determining devices; and, at least one computer operatively connected to the plurality of position determining devices to receive position information from the position determining devices and operatively connected to the plurality of temperature sensors to receiver temperature measurements from the plurality of temperature sensors, the at least one computer operative to create a virtual mapping of the room indicating the approximate positions of the plurality of temperature sensors in the room based on the position information received from the position determining devices.

In accordance with another broad aspect of the invention, there is provided a rack for holding at least one computer server, the rack comprising: a frame for supporting the at least one server; a control system provided on the rack and connectable to a computer, the control system operative to transfer information to the computer; a position determining device operatively connected to the control system, the position determining device operative to obtain position information position and communicate the position information to the control system; and at least one temperature sensor provided on the rack and operative to take a temperature measurement and communicate the temperature measurement to the control system.

In accordance with another broad aspect of the invention, there is provided a method for generating a virtual mapping of a room indicating approximate positions of a plurality of temperature sensors in the room, the method comprising: for each of the temperature sensors, automatically obtaining position information associated with the temperature sensor; generating the virtual mapping by, for each of the plurality of temperature sensors, using the position information associated with the temperature sensor to plot the position of the temperature sensor in the virtual mapping; and using the virtual mapping to visually represent a location in the room where a temperature measurement was taken by one of the plurality of temperature sensors.

In accordance with another broad aspect of the invention, there is provided a method for providing a visual representation of a location of a temperature measurement in a room, the method comprising: obtaining a temperature measurement from a temperature sensor; obtaining position information from a position determining device associated with the temperature sensor; and indicating a position in the room where the temperature measurement was taken using the position information.

In accordance with another broad aspect of the invention, there is provided a computer for generating a virtual mapping of a server room, the computer comprising: an input device operative to receive temperature measurements from a plurality of temperature sensors and position information from a plurality of position determining devices; at least one memory containing program instructions; at least one processing unit operably connected to the input device and the at least one memory, the at least one processing unit, in response to the program instructions, operative to: obtain position information from a plurality of position determining devices, each position determining device associated with at least one temperature sensor; generate a virtual mapping of the room by, for each position determining device, plotting the position of the at least one temperature sensor associated with the position determining device using the position information obtained from the position determining device; and using the virtual mapping, visually representing a location in a room where a temperature measurement was taken by one of the temperature sensors.

It is to be understood that other aspects of the present invention will become readily apparent to those skilled in the art from the following detailed description, wherein various embodiments of the invention are shown and described by way for illustration. As will be realized, the invention is capable for other and different embodiments and is several its several details are capable of modification in various other respects, all without departing from the spirit and scope of the present invention. Accordingly the drawings and detailed description are to be regarded as illustrative in nature and not as restrictive.

BRIEF DESCRIPTION OF THE DRAWINGS

Referring to the drawings wherein like reference numerals indicate similar parts throughout the several views, several aspects of the present invention are illustrated by way of example, and not by way of limitation, in detail in the figures, wherein.

DESCRIPTION OF VARIOUS EMBODIMENTS

The detailed description set forth below in connection with the appended drawings is intended as a description of various embodiments of the present invention and is not intended to represent the only embodiments contemplated by the inventor. The detailed description includes specific details for the purpose of providing a comprehensive understanding of the present invention. However, it will be apparent to those skilled in the art that the present invention may be practiced without these specific details.

Figure 1:
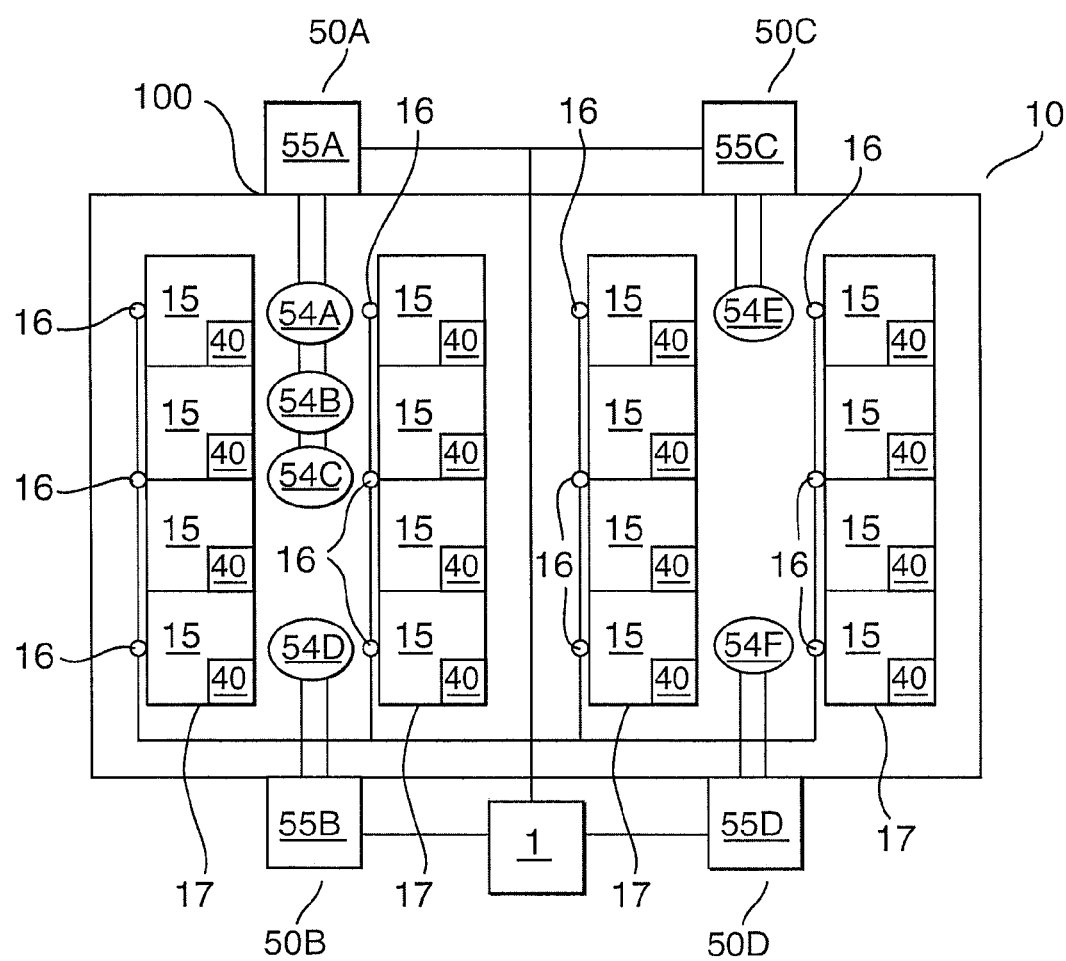
FIG. 1 is a schematic plan view of a room being cooled by a cooling system.

FIG. 1 illustrates a server room 10 that is cooled by a cooling system 1 in a schematic plan view, such as a data center. Server room 10 is representative of rooms housing electronics such as servers, storage, computers, etc. that generate considerable heat and are sensitive to heat such that the room 10 must be air conditioned.

Room 10, for example, may have a plurality of racks 15 with each rack 15 having a plurality of devices (not shown), such as servers or other devices that generate heat as a byproduct of their operation. Additionally, each device in the room 10 will not necessarily generate the same amount of heat. Often, different devices in the room 10 will generate different amounts of heat with some devices generating significantly more heat than other devices. The racks 15 can be distributed through the room 10 to allow access to the devices in the racks 15 and provide room between the racks 15 and devices to allow flows of cooled air to pass between the racks 15. Typically, the racks 15 can be arranged in one or more rows 17 within the room 10, allowing a person to move in between the racks 15 and gain access to the one or more devices contained in each rack 15. A person skilled in the art will appreciate that more or less racks 15 and rows 17 than the number shown in FIG. 1 could be used in room 10.

The cooling system 100 can be used to cool the room 10 and compensate for the heat generated by the devices in the room 10. In one aspect, the cooling system 100 can have a plurality of cooling supplies 50A, 50B, 50C, 50D operative to supply cooled air to the room 10. In one aspect, as illustrated in FIG. 1, each of the cooling supplies 50A, 50B, 50C, 50D could comprise an air conditioning unit and one or more inlets operably connected to one of the air conditioning units. In this manner, cooled air supplied to the room 10 by each of the cooling supplies 50A, 50B, 50C, 50D can be varied independently from each of the other cooling supplies 50A, 50B, 50C, 50D. For example, in FIG. 1 the first cooling supply 50A includes a first air conditioning unit 55A and inlets 54A, 54B, 54C, a second cooling supply 50B includes a second air conditioning unit 55B and inlet 54D, a third cooling supply 50C includes a third air conditioning unit 55C and inlet 54E, and a fourth cooling supply 50D includes a fourth air conditioning unit 55D and inlet 54F. Although FIG. 1 illustrates four cooling supplies 50A, 50B, 50C, 50D, a person skilled in the art will appreciate that more or less cooling supplies could be used to supply cooled air to the room 10.

The plurality of inlets 54A, 54B, 54C, 54D, 54E, 54F can be provided leading into the room 10. These inlets 54A, 54B, 54C, 54D, 54E, 54F can be mounted in the ceiling, walls or floors of the room 10. These inlets 54A, 54B, 54C, 54D, 54E, 54F can be operably connected to the air conditioning units 55A, 55B, 55C, 55D so that each air conditioning unit 55A, 55B, 55C, 55D cools air and then routes the cooled air into the room 10 through the corresponding inlet(s) 54A, 54B, 54C, 54D, 54E, 54F, that is operably connected to the air conditioning unit 55A, 55B, 55C, 55D. As shown in FIG. 1, in some aspect more than one inlet 54A, 54B, 54C can be connected to a single air conditioning unit 55A, so that a flow of air that has been cooled by the air conditioning unit 55A can be routed into the room 10 through any of inlets 54A, 54B, 54C.

The inlets 54A, 54B, 54C, 54D, 54E, 54F can be spaced around the room 10 so that each air inlet 54A, 54B, 54C, 54D, 54E, 54F tends to be directed at a specific portion of the room 10.

Each cooling supply 50A, 50B, 50C, 50D can be independently controllable so that a flow of cooled air supplied to the room 10 by each cooling supply 50A, 50B, 50C, 50D is separately controllable. In this manner, each cooling supply 50A, 50B, 50C, 50D can have the amount of cooling being supplied to the room 10 varied independently of the other cooling supplies 50A, 50B, 50C, 50D by controlling the operation of the different air conditioning units 55A, 55B, 55C, 55D.

Figure 2:
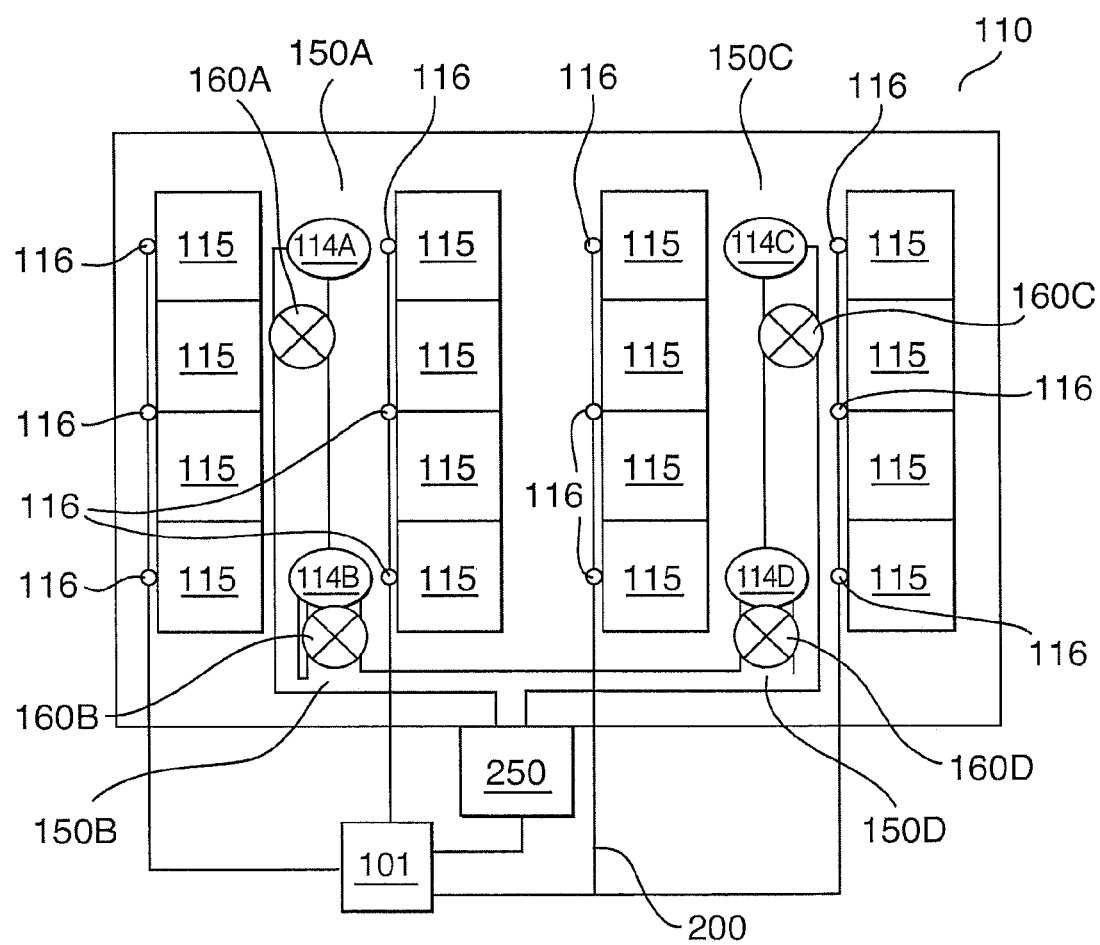
FIG. 2 is a schematic plan view of an further aspect of a room being cooled by a cooling system.

FIG. 2 illustrates a room 110 in another aspect that contains a plurality of rack 115 holding computer devices, which can have a cooling system 200 having cooling supplies 150A, 150B, 150C, 150D. Cooling supplies 150A, 150B, 150C, 150D can be provided and wherein each cooling supply 150A, 150B, 150C, 150D can be supplied with cooled air from a single central air conditioning unit 155. Each cooling supply 150A, 150B, 150C, 150D can have an inlet 114A, 114B, 114C, 114D operably connected to the central air conditioning unit 250. Damper 160A, 160B, 160C, 160D can be provided between each inlet 114A, 114B, 114C, 114D and the central air condition unit 155 allowing the cooling provided to the room 110 by each inlet 114A, 114B, 114C, 114D to be varied by operation of the respective damper 160A, 160B, 160C, 160D. In this manner each cooling supply 150A, 150B, 150C, 150D can be varied by controlling the amount of cooled air from the central air conditioning unit 250 that is passing out of the air inlet 114A, 114B, 114C, 114D associated with the cooling supply 150A, 150B, 150C, 150D.

A plurality of temperature sensors 116 can be provided throughout the room 110, with the temperatures sensors 116 operative to take temperature measurements and communicate them to a central computer 101 in one aspect. In an aspect, the central computer 101 may be operably connected to the cooling supplies 150A, 150B, 150C, 150D so that the central computer 101 can control the operation of the cooling supplies 150A, 150B, 150C, 150D.

Although FIG. 2 illustrates four (4) cooling supplies 150A, 150B, 150C, 150D a person skilled in the art will appreciate that more or fewer cooling supplies could be used.

Referring again to FIG. 1, a plurality of temperature sensors 16 can be provided throughout the room 10 (or a plurality of temperature sensors 116 can be provided throughout room 110 shown in FIG. 2). Each temperature sensor 16 can be capable of measuring the temperature of the air in the room 10 at the location where the temperature sensor 16 is located.

In one aspect, the temperature sensors 16 can be operatively connected via a communication link to a central computer 1 for ease of monitoring. The temperature sensors 16 may be linked to a central computer 1 in order to facilitate collecting information once or a plurality of times from the temperature sensors 16 and possibly to provide for automated collection and analysis. Each temperature sensor 16 can be operably connected to a central computer 1 so that temperature measurements taken by the temperature sensors 16 can be communicated to the central computer 1.

A Position determining device 40 can also be provided on each rack 15. Each Position determining device 40 can be connected to the central computer 1 to communicate position information obtained by the Position determining device 40 to the central computer 1.

Figure 3:
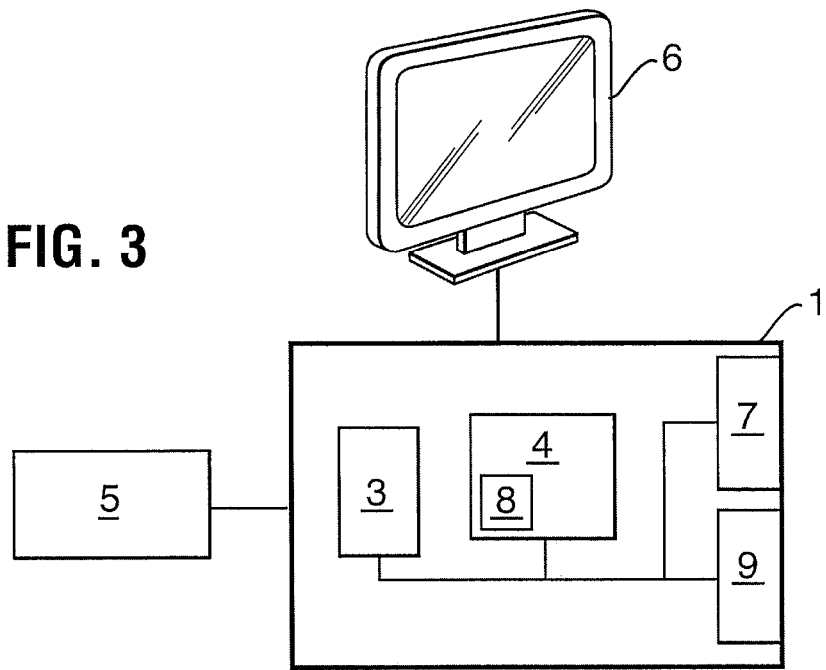
FIG. 3 is a schematic illustration of a central computer.

FIG. 3 illustrates a central computer 1 suitable for supporting the operation of methods in accordance with the present invention. Computer 1 can comprise: at least one processing unit 3; a memory storage device 4; at least one input device 5; a display device 6 and a program module 8. The processing unit 3 can be any processor that is typically known in the art with the capacity to run the program and is operatively coupled to the memory storage device 4 through a system bus. In some circumstances the computer 1 may contain more than one processing unit 3. The memory storage device 4 is operative to store data and can be any storage device that is known in the art, such as a local hard-disk, etc. and can include local memory employed during actual execution of the program code, bulk storage, and cache memories for providing temporary storage. Additionally, the memory storage device 4 can be an external computer readable memory, such as a database, that is external to the data processing system 1 but operatively coupled to the computer 1. The input device 5 can be any suitable device suitable for inputting data into the computer 1, such as a keyboard, mouse or data port such as a network connection and is operatively coupled to the processing unit 3 and operative to allow the processing unit 3 to receive information from the input device 5. The display device 6 can be a CRT, LCD monitor, etc. operatively coupled to the computer 1 and operative to display information. The display device 6 could be a stand-alone screen or if the computer 1 is a mobile device, the display device 6 could be integrated into a casing containing the processing unit 3 and the memory storage device 4. Program instructions 8 can be stored in the memory storage device 4 and operative to provide instructions to processing unit 3 and the processing unit 3 is responsive to the instructions from the program instructions 8.

In one aspect, the computer 1 may have an input device 7, such as an I/O digital/analog data port, serial interface, network connection, etc., to operatively connect the computer 1 to the temperature sensors 16 and allow temperature measurements taken by the temperature sensors 16 to be communicated to the computer 1. The input device 7 can also allow the computer 1 to be in communication with the Position determining devices 40 allowing the computer 1 to obtain position information from the different Position determining devices 40. The input device 7 could allow the computer 1 to be directly wired to the temperature sensors 16 or allow wireless communication between the computer 1 and the temperature sensors 16. An output device 9, such as an I/O digital analog data port, serial interface, network connection, etc. could be provided to allow the computer 1 to communicate with the cooling supplies 50A, 50B, 50C, 50D and control the operation of the cooling supplies 50A, 50B, 50C, 50D. The output device 9 could provide a wired or wireless communication link with the cooling supplies 50A, 50B, 50C, 50D.

Although other internal components of the computer 1 are not illustrated, it will be understood by those of ordinary skill in the art that only the components of the computer 1 necessary for an understanding of the present invention are illustrated and that many more components and interconnections between them are well known and can be used.

The temperature sensors 16 may be mounted in the room in various ways. In one aspect, the temperature sensors 16 may be simply installed at various locations throughout the room 10, possibly at relatively regular spaced intervals. The temperature sensors 16 can be positioned so that they are distributed throughout the room 10, with at least one of the temperature sensors 16 being positioned generally centrally in the room 10. However, in another aspect, the temperatures sensors 16 can be installed on at least some of the racks 15 to be capable of measuring the temperature of the air at the different racks 15. In another aspect, temperature sensors 16 can be installed on a major portion of the racks 15 so that the temperature of the air located at each rack 15 can be monitored by the central computer 1. In another aspect, temperature sensors 16 can be mounted to each rack 15 in the room 10.

As will be appreciated, a greater number of temperature sensors 16 will provide the central computer 1 with a more detailed analysis of the temperature conditions through the room 10.

In one embodiment, the temperature sensors 16 are linked to the central computer 1 and the central computer 1 is also operatively connected to the cooling supplies 50A, 50B, 50C, 50D to provide for control of the air conditioning units/volume and temperature of flows through inlets and may provide for control of components in the room (i.e. control of the rack cooling systems, control of one or more devices in one or more racks, etc.).

Figure 4:
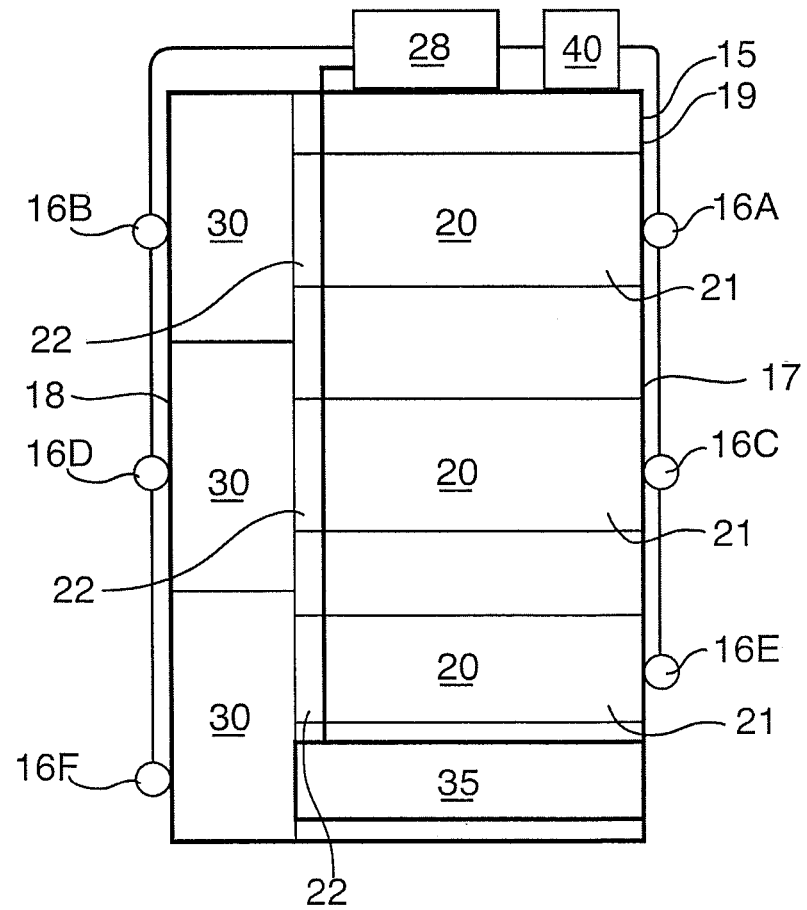
FIG. 4 is a schematic illustration of a rack containing a number of temperature sensors.

Referring to FIG. 4 is a schematic of a rack 15. The rack 15 will have a frame 19 that is constructed to hold a number of devices 20, such as servers. In one aspect, each rack 15 can have a number of temperature sensors 16A, 16B, 16C, 16D, 16E, 16F installed relative to the rack 15 with the temperature sensors 16A, 16B, 16C, 16D, 16E, 16F installed at different heights. In this manner, the temperature of the air surrounding the rack 15 can be measured at various heights. Although rack 15 is shown in FIG. 4 a person skilled in the art will appreciate that racks 115 shown in FIG. 2 could also be configured in this manner. The temperature sensors 16A, 16B, 16C, 16D, 16E, 16F may be positioned on the racks 15 in various locations, for example on an exterior or interior position of a rack 15 or on a device 20 within the rack 15. In one embodiment, temperature sensors 16A, 16C, 16E may be positioned in a cooling air intake of a rack 15, such as a fan intake. These temperature sensors 16A, 16C, 16E may be useful to assist with an optimization of room cooling and may be used to detect the thermal condition of the air intake for rack 15 or device 20 and so may have a plurality of purposes. In particular, reference may be made to applicant's corresponding U.S. patent application Ser. No. 11/969,766 wherein a system for predicting the cooling requirements of a rack or device is described.

In one aspect, the temperature sensors 16A, 16B, 16C, 16D, 16E, 16F are installed in the rack 15 and associated in inlet/outlet pairs, with inlet temperature sensors 16A, 16C, 16E of each inlet/outlet pair provided on a first side of the rack 15. The inlet temperature sensors 16A, 16C, 16E can be placed in an intake path of air entering the rack 15 on a first side 17 of the rack 15 to measure the temperature of air entering the rack 15 before it passes by the devices 20 in the rack 15. These inlet temperature sensors 16A, 16C, 16E can be positioned proximate to inlet ends 21 of the devices 20. The outlet temperature sensors 16B, 16D, 16F of the inlet/outlet pairs can be mounted on a second side 18 of the rack 15, proximate discharge ends 22 of the devices 20, to measure the temperature of air that has passed through or by the devices 20 in the rack 15. For example, in FIG. 4, temperature sensors 16A and 16B may be an associated inlet/outlet pair, temperature sensors 16C and 16D may be an associated inlet/outlet pair and temperature sensors 16E and 16F may be an associated inlet/outlet pair. In this manner, a temperature differential measured between one the associated inlet/outlet pairs can be used to identify a device 20 in the rack 15 that is generating significant heat. For example, if the temperature measurements taken between the inlet temperature sensor 16A and the outlet temperature sensor 16B show that the temperature being measured by the outlet temperature sensor 16B is much greater than the temperature of the air entering the rack 15 where temperature sensor 16A is located, this could indicate that the device 20 positioned between the inlet temperature sensor 16A and outlet temperature sensor 16B is generating a significant amount of heat. This information could then be used to supply more cool air to the rack 15, to provide spot cooling to the device 20 generating the heat, move the device 20 to a cooler part of the room 10, etc.

Each rack 15 can be provided with one or more fans 30 so that ambient air from intake ends 21 of the devices 20 is drawn over and/or through the devices 20, past discharge ends 22 of the devices 20 and into the fans 30 to cool the electric components of the devices 20. The fans 30 are shown positioned proximate to the discharge ends 22 of the devices 20 to draw air through or over the devices 20, however, a person skilled in the art will appreciate that the fans 30 could be positioned proximate to the intake ends 21 of the device 20, be incorporated inside the devices 20, etc.

A control system 28 can be provided with each rack 15, with the control device 28 being operatively connected, either directly, wirelessly, through other components, etc. to the temperature sensors 16A, 16B, 16C, 16D, 16E, 16F positioned on the rack 15 so that the control system 28 can obtain temperature measurements recorded by the temperature sensors 16A, 16B, 16C, 16D, 16E, 16F.

The control system 28 can be operatively connected to a position determining device 40. In one aspect, the position determining device 40 could be an internal component of the control system 28 so that the position determining device 40 and the control system 28 are grouped together as a single device. The position determining device 40 can be operative to determine position information, such as the approximate location and/or coordinates of the position determining device 40. In this manner, the position determining device 40 can be used in conjunction with the control system 28 to determine the approximate location of the rack 15 and/or the temperature sensors 16A, 16B, 16D, 16E, 16F in the room 10 (or room 110).

The position determining device 40 can be any suitable device operative to approximate its position. For example, the position determining device 40 could be signal receiver operative to receive one or more signals such as an IR signal, ultrasonic signal, radio frequency signal, etc. and uses these signals to approximate its position, such as by evaluating the signal strength to determine its approximate distance from a signal source, triangulation of multiple signals, etc.

In another aspect, the position determining device 40 could be a GPS receiver operative to receive signals from GPS satellites and use the received signals to approximate its position.

In one aspect, if the position determining device 40 is a GPS receiver, it can be operative to receive position information in the form of signals from GPS satellites and communicate the signals to the control system 28 allowing the control system 28 to use the signals to determine a location of the position determining device 40. In another aspect, the position determining device 40 can receive signals from the GPS satellites and communicate the signals to the central computer 1 through the control system 28, allowing the central computer 1 to determine the location of the position determining device 40 using the communicated signals as the position information. In yet another aspect, the position determining device 40 could receive signals from the GPS satellites and use the signals to determine the position of the position determining device 40 for the position information. The position determining device 40 can then communicate this position information to the control system 28, which in turn can communicate this position information to the central computer 1. In this manner, the control system 28 can obtain position information from the position determining device 40 regarding the location of the rack 15.

In one aspect, the position determining device 40 can be positioned on the rack 15 so that the position information obtained using the position determining device 40 will be related to the position of the rack 15 in the room 10. In a further aspect, the rack 15 is standardized so that the positioning of the position determining device 40 in the rack 15 is at a standardized position in each rack 15. In this manner, depending on how accurate the positioning information obtained using the position determining device 40 is, by using the standardized positioning of the position determining device 40 in the rack 15, a more accurate approximation of the location of the rack 15 can be obtained. If the rack 15 is standardized so that other components in the rack 15 are positioned in standardized positions, i.e. the temperature sensors 16A, 16B, 16C, 16D, 16E, 16F, the devices 20, power supply 35, etc., the location of these components relative to the position determining device 40 can be approximated using position information obtained from the position determining device 40 and the standardized distance of these components from the standardized position of the position determining device 40. By having these other components a standardized distance from the position determining device 40 in the rack 15, the positions of these components can be related back to the position information using the position determining device 40 and the position of the components approximated by relating the position of the components in the rack 15 to the position of the position determining device 40 to the rack 15.

In a further embodiment, the dimensions of the rack 15, such as the height, width and depth could also be standardized between racks 15 so that all racks 15 have the same known dimensions. By knowing the standardized position of the position determining device 40 in the rack 15, and knowing the dimensions of the rack 15, i.e. the width, height, depth, position of the position determining device 40 from the sides of the rack 15, top of the rack 15, etc., the location of the rack 15 and the dimensions of the rack 15 can also be approximated using the positioning information obtained from the position determining device 40.

The control system 28 can also be operatively connected to a power supply 35 that supplies power to the different devices 20 in the rack 15. The control system 28 can be operatively connected to the power supply 35 such that the control device 28 can obtain information from the power supply 35 regarding how much power is being supplied to the device 20 in the rack 15 by the power supply 35. The power supply 35 may be directed connected to the control system 28 or wireless connected to the control system 28 to allow the power supply 35 to communicate its status to the control system 28. In one aspect, the communication may be as close to real time as possible so that the control system 28 is aware of the status of the power supply 35 as the status of the power supply 35 is changing.

The control system 128 can also be operatively connected to the fan 30, so that the control system 128 can control the operation of the fan 30, such as by controlling the operating speed of the fan 30, turning the fan 30 on or off, etc.

Referring to FIGS. 1 and 4, the control system 28 of each rack 15 can be operatively connected to the central computer 1 so that all the information obtained by the control systems 28 on the various racks 15 can be communicated to the central computer 1, including the positioning information obtained using the position determining device 40. This information could include temperature measurements from the temperature sensors 16A, 16B, 16C, 16D, 16E, 16F mounted on the rack 15, power draw by the power supply 35, information from the devices 20 in the rack 15, operation of the fans 30, etc. This information can be stored on a memory of the control system 28 and/or communicated to the central computer 1. The information from each control system 28 can include an identifier indicating which control system 28 provided the information to the central computer 1, allowing the central computer 1 to determine which control system 28 obtained the information and even which rack 15 the information came from. For example, in this manner the central computer 1 can determine from a temperature measurement taken by a temperature sensor 15 in the room 10, which rack 15 in the room 10 the temperature sensor 16 is installed on and therefore what the temperature is at that specific rack 15.

The control system 28 can operate as that disclosed in applicant's corresponding U.S. application Ser. No. 11/969,766. Control system 28 can monitor temperature information and also power from power supply 30 such that system can also operate in a predictive cooling system.

Referring again to FIG. 1, the temperature information obtained can be used to generate reports and logged information for room managers and, for example, to verify energy efficient operations or for system diagnostics. Ongoing temperature sensing can be used to generate substantially real time feedback and, for example, visual representations of room cooling.

With the information collected from the temperature sensors 16 provided throughout the room 10 (or temperature sensors 116 throughout room 110), the information can be used to provide a visualization of the temperatures throughout the room 10. If the locations or approximate locations of the various temperatures sensors 16 are known to the central computer 1 (or if the temperature sensors 16 are installed on racks, the approximate locations of the racks 15 and which temperature sensors 16 installed on which racks 15 are known), the central computer 1 can provide a visualization of the temperatures throughout the room 10. In this manner, an operator can easily see areas in the room 10 that are hotter or cooler relative to other areas. If a number of temperature sensors 16A, 16B, 16C, 16D, 16E, 16F are installed at different heights on a rack 15, as shown in FIG. 4, the central computer 1 can provide a three dimensional visualization of the temperatures in the room 10 at various heights.

With the collected temperature information, locations in the room 10 (or room 110) that are either warmer or cooler than desired can be determined. Rather than, attempting to predictively model where warm spots or cools spots in the room 10 may be located, the present system allows measurements to be taken throughout the room 10 and actual existing warm spots and cool spots determined based on the actual operation of the cooling system 100. In this manner, using the temperature measurement collected throughout the room 10 or room 110, the cooling supplies 50A, 50B, 50C, 50D or cooling supplies 150A, 150B, 150C, 150D can be adjusted until the desired temperatures are reached, additional cooling supplies can be provided, spot cooling provided, devices located in the room moved around, etc.

In one aspect, using the inlet/outlet pair of temperature sensors positioned on the rack 15 as shown in FIG. 4, by determining a temperature differential between the inlet temperature sensors 16A, 16C, 16E and the associated outlet temperature sensors 16B, 16D, 16F, devices 20 in the room 10 that are running hotter than expected can be located and dealt with, such as by providing more cooling to the devices in the room 10 using one or more of the cooling supplies 50A, 50B, 50C, 50D, adding spot cooling to the room 10 at the location of the devices, etc.

In one aspect, not only can the information obtained from the system be useful to allow visualization of the room 10 (or room 110), provide insight into the temperature of air throughout the room 10 (or room 110), allow problems in the cooling to be diagnosed and addressed, etc., the system can be used to approximate how much effect each cooling supply 150A, 150B, 150C, 150D has on the temperatures being measured throughout the room 10. Rather than trying to predictively model the effects of the various cooling supplies 50A, 50B, 50C, 50D on the temperature of the air throughout the room 10, (or the effects of the various cooling supplies 150A, 150B, 150C, 150D on the room 110) a configuration method can be performed allowing the effect of each cooling supply 50A, 50B, 50C, 50D to be determined at various locations throughout the room 10. In this manner, how the operation of the various cooling supplies 50A, 50B, 50C, 50D will affect the temperature of the air throughout the room 10 can be determined and used to control the operation of the cooling system 100.

Although the cooling system 100 in one aspect of operation, can be used to automatically cool the room 10 by the methods described herein (or the cooling system 200 and room 110) without the necessity of the knowing the specific locations of racks 15 and the temperature sensors 16 in the room, in some aspects, it can be desirable or even necessary to know the positions of the racks 15 and temperature sensors 16. This is especially true when it is desirable to provide a visual representation of temperature measurements throughout the room 10, such as at a specific time, over a range of times, in substantially real-time, etc.

To provide a virtual visual representation of temperature measurements throughout the room 10, a virtual mapping of the room 10 can be generated with at least approximate locations of the temperature sensors 16 indicated. With the locations of the temperature sensors 16 in the room 10 indicated in the virtual mapping, temperature measurements taken by the temperature sensors 16 can be visually represented, such as with a color, number, etc, at the approximate location in the room 10 where the temperature measurement was taken. This can allow the room 10 to be visually represented/displayed to an operator of the cooling system 100, such as on the display device 6 of the central computer 1 shown in FIG. 1, indicating which temperature sensors 16 and which racks 15 are registering what approximate temperatures.

To create a virtual mapping of the room 10, the racks 15 and devices 20 have to be installed in the room 10. This is typically done by placing the racks 15 in their desired positions in the room 10, typically in rows 17, and then installing the devices 20, such as the servers, etc. in each of the racks 15. The temperature sensors 16 can be installed on the racks 15 (this can occur much later than the installation and position of the racks 15, especially true if the racks 15 and devices 20 are already present in the room 10 and are being retrofitted with the cooling system 100) and then connected to the appropriate control system 28. The control systems 28 can then be connected to the central computer 1 so that information obtained by each control systems 28, such as temperature measurements, etc., can be communicated to the central computer 1.

Typically, the approximate locations of the temperature sensors 16 in the room 10 will have to be known to provide a visual representation of the room 10. Additionally, it may be desirable to know the positioning of the various racks 15 in the room 10. In one aspect, installers can go through the room 10 taking measurements and using the manually obtained measurements to virtually map the room 10 allowing a virtual visual representation of the room 10 to be displayed. Measurements can be taken of the size of the room 10 and measurements indicating the location of each rack 15 in the room 10 can then be taken. In a further aspect, measurements indicating the specific positions of the various temperature sensors 16 can also be taken. All of these measurements can then be manually entered into a computer, such as the central computer 1, including the dimensions of the room 10 and the location of each rack 15 and possibly each temperature sensor 16 in the room to create a virtual mapping of the room 10, inserting each rack 15 and/or temperature sensor 16 into the virtual mapping of the room 10 at their approximate location in the room 10.

Figures 5, 6:
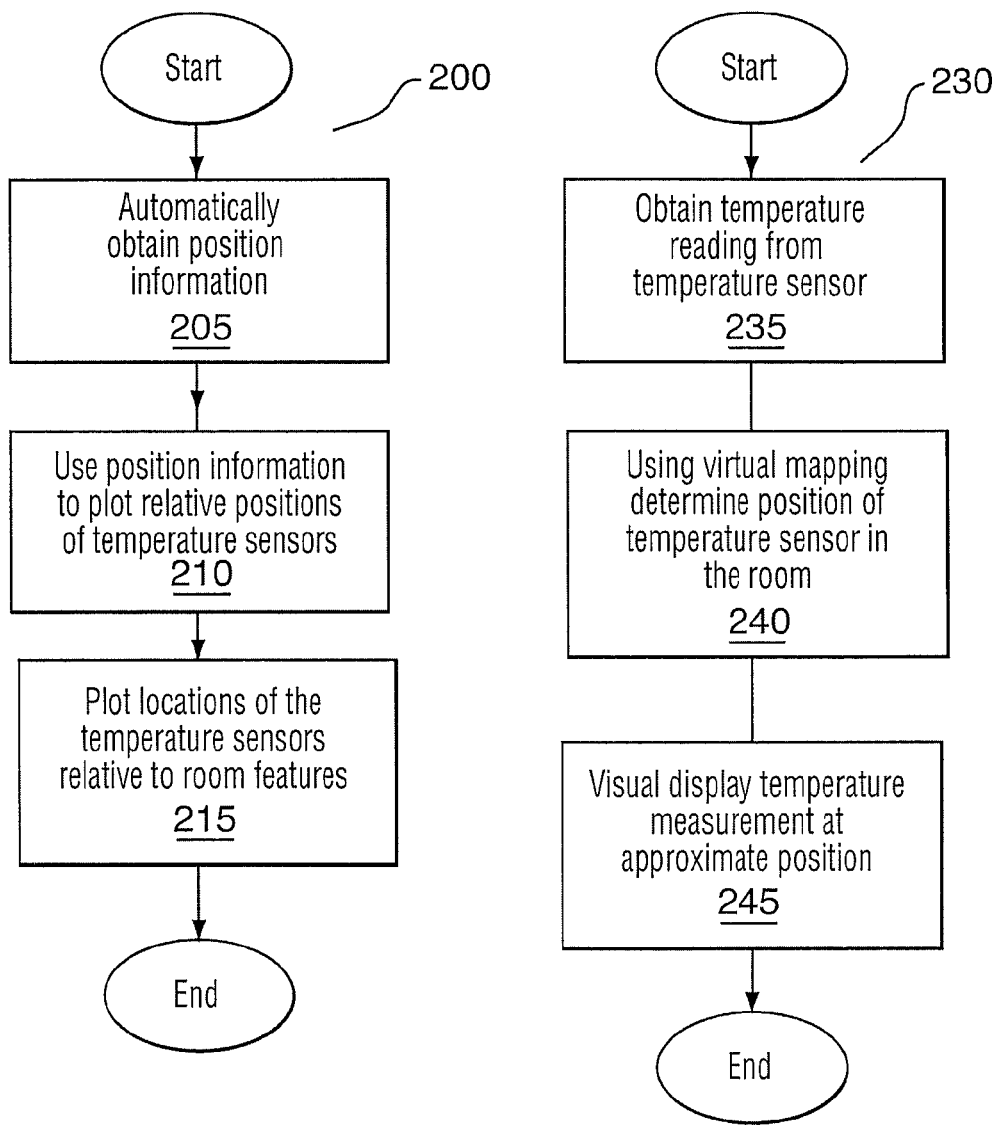
FIG. 5 is a flowchart illustrating a method of generating a virtual mapping of a room.
FIG. 6 is a flowchart illustrating a method of visually representing a temperature measurement and its location in a room.

In a further aspect, if a position determining device 40 is provided and associated with each rack 15 and/or one or more temperature sensors 16, the position information obtained using the position determining device 40 can be used to generate a virtual map of the room 10 that can later be used to provide a visual representation of the temperature measurements in the room 10. FIG. 5 illustrates a method 200 of generating a virtual mapping of a room 10, room 110 or some other room, to be used to monitor temperatures throughout the room 10.

Referring to FIGS. 1 and 4, the racks 15 can be positioned in the room 10 and the temperature sensors 16 on the racks 15 can be connected to the control system 28 associated with the rack 15. The room 10 shown in FIG. 1 is used as way of example with method 200, but a person skilled in the art will appreciate that similar rooms, such as room 110 shown in FIG. 2 could also be used with method 200. Each control system 28 can also be connected to a position determining device 40 associated with the rack 15. All of the control systems 28 can then be connected to the central computer 1. With these preliminary installations in place, the method 200 can then be performed to generate a virtual mapping of the room 10 indicating the position of the racks 15 in the room 10 and in one aspect, the position of the temperature sensors 16 and the outer dimensions of the racks 15. This virtual mapping generated using method 200 can then be used to visually represent the room 10, such as on a display device 6 of the central computer 1, indicating to a user various temperature measurements taken throughout the room 10.

Once initial measurements are known, method 200 can start and step 205 can be performed. At step 205 position information can be automatically obtained from the position determining devices 40. Rather than requiring the position of the racks 15 to be determined manually by a human operator, the position information can be obtained automatically, without manual measurements taken by human intervention. The position information can be automatically obtained from a single determining of the position determining devices 40 (i.e. at a specific point in time) or in a further aspect, the position information could be obtained over a period of time, such as a number of hours, days, etc. to try and obtain a more accurate location of the position determining devices 40, such as by averaging a number of varying coordinates obtained from each position determining devices 40.

At step 210, the position information can be used to plot the relative positions of the racks 15 and/or temperature sensors 16 in the virtual map. The position determining device 40 are associated with a rack 15, so by using the position information obtained from a position determining device 40 associated with a rack 15 the position of the rack 15 can be approximated. If each or some of the temperature sensors 16 are associated with a rack 15, the position information obtained from a position determining device 40 associated with a rack 15 can be used to approximate the location of the temperature sensors 16 associated with the same rack 15. The positions of the temperature sensors 16 and/or racks 15 can be added to the virtual mapping of the room 10 being generated by the method 200, indicating the relative positions of the racks 15 and/or temperatures sensors 16 in the room 10.

With the relative position of the racks 15 and/or temperature sensors 16 plotted in step 210, measurements of the room 10 can be used in step 215 to plot the position of the racks 15 and/or temperature sensors 16 relative to the room 10 in the virtual mapping. The measurements taken of the room 10 can be used to plot the features of the room 10, such as the size of the room, such as length, width and optionally the height, in the virtual mapping and a measurement taken between a known point of the room 10 (e.g. from a wall of the room, corner of the room, etc.) to a position in the room 10 such as a rack 15 and/or temperature sensor 16. Using this measurement as a reference measurement, the features of the room 10 can be related to the obtained position information from the position determining device 40 indicating the approximate positions of the racks 15 and/or temperature sensors 16 in the room 10. In this manner, the outlines of the room 10 can be plotted on the virtual mapping being created by method 200 and the measurement of one or more features of the room 10 relative to positions of one or more racks 15 and/or temperatures sensors 16 used as a reference measurement to relate the obtained position information from the position determining device 40 to the features of the room 10. Additionally, if the measurements are obtained for other features of the room 10, such as the air inlets, doors, etc. these can also be used at step 215 in plotting the virtual mapping allowing the approximate positions of these types of features to be indicated in the virtual mapping generated using method 200.

With the virtual mapping of the room 10 completed, the method 200 can end. The generated virtual mapping can then be used to visually represent to a user approximately where in the room 10 a temperature measurement has been taken. For example, if the approximate position of a temperature sensor 16 is plotted in the virtual mapping, the virtual mapping can indicate in a visual representation the approximate location where a temperature measurement taken by that temperature sensor 16 was taken. The visual representation could be a number indicating the temperature measurement, a color, etc.

If a temperature sensor 16 is not plotted in the virtual mapping, but the temperature sensor 16 is associated with a rack 15 and the approximate position of the rack 15 is plotted in the virtual mapping, a temperature recording by the temperature sensor 16 could be visually represented by determining the rack 15 associated with the temperature sensor 16 and using the approximate position of the associated rack 15 indicated in the virtual mapping to show the approximate location in the room 10 where the temperature measurement was taken by the temperature sensor 16.

In this manner, the location of the various racks 15 and/or temperature sensors 16 in the room 10 can be plotted to generate a virtual mapping of the room 10. This virtual mapping can then be used to visually display the approximate location of temperature measurements taken throughout the room 10.

FIG. 6 illustrates one method 230 that can be used to visually represent a temperature measurement obtained from the temperature sensor 16 in the room 10 and using a virtual mapping of the room 10 to visually represent a location in the room where the temperature measurement was taken. The method 230 can start and at step 235 one or more temperature measurements can be obtained from one or more temperature sensors 16 in the room 10.

At step 240 a virtual mapping of the room 10, indicating the approximate positions of the temperature sensors 16 in the room 10, can be used to determine the approximate position of the temperature sensor 16 or temperature sensors 16 that took the temperature measurement(s). Then, at step 245, the temperature measurement(s) can be visually indicated where the temperature sensor 16 or temperature sensors 16 are approximately located in the room 10. A person skilled in the art will appreciate that method 230 can also be used with rooms other than room 10, such as room 110.

Figure 7:
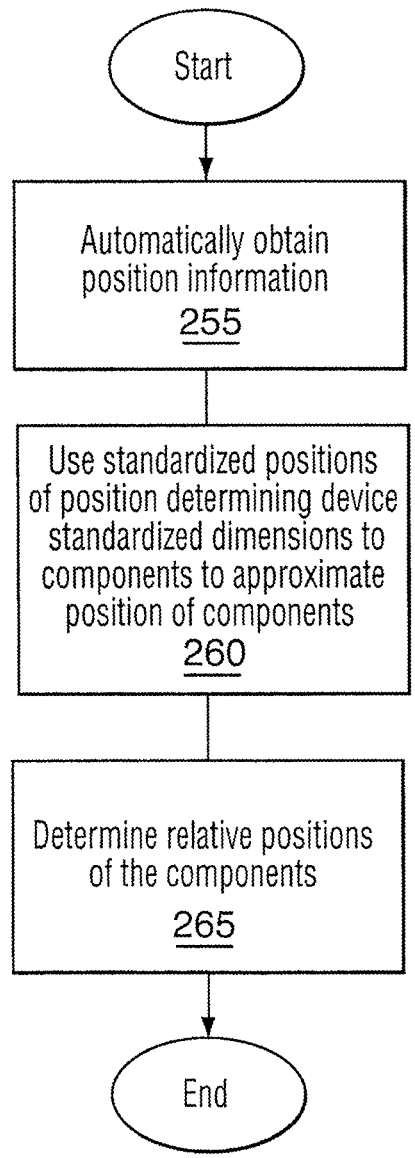
FIG. 7 is a flowchart illustrating a further method of generating a virtual mapping of a room.

Method 200 shown in FIG. 5 can be used to provide a virtual mapping indicating the approximate positions of the temperature sensors 16 in the room 10 by using the approximate position of the position determining devices 40 as the approximate positions of the temperature sensors 16 associated with each position determining device 40. If more accurate approximate positions are desired, such as when there are a number of temperature sensors 16 associated with each position determining device 40, a method to determine a more accurate approximate position of the temperature sensors 16 can be used. FIG. 7 is a flow chart illustrating a method 250 that can be performed to map the location of racks 15 and other items in a room 10.

The method 250 starts and step 255 is performed with position information being automatically obtained. Automatically obtained meaning without manual measurements taken by human intervention. The position information can be automatically obtained from the position determining device 40 associated with each of the racks 15 and indicating the approximate location of the position determining device 40.

At step 260, the position information of each of the racks 15 can be combined with the standardized dimensions of the racks 15 to approximate the relative positions of the components in the racks, such as the temperature sensors 16, devices 20, etc. Using the standardized dimensions of the racks 15, such as the standardized position of the position determining device 40 in the rack 16 and the standardized distances of the other components in the rack 15 from the standardized position of the position determining device 40 in the rack 15, the position information obtained from a position determining device 40 position in a rack 15 can be used to derive the approximate positions of components that are also installed in the rack 15 relative to the position determining device 40, such as the temperature sensors 15.

The method 250 can then move to step 265 and determine the relative positions of the racks 15 and/or temperature sensors 16 and other components in the racks 15, relative to one another.

With the relative positions of the racks 15, temperature sensors 16, etc. determined at step 265, measurements of the room 10 can be used to plot the racks 15, temperature sensors 16, etc. relative to the features of the room 10 and with these plotted positions a virtual mapping of the room 10 can be generated and the method 250 can end.

After performing method 250, a virtual mapping of the room 10 can be constructed with the approximate relative positions of the temperature sensors 16, racks 15, devices 20, etc. plotted in the virtual mapping. Depending on how accurate the position information obtained form the position determining device 40 is, the virtual mapping can show a relatively accurate virtual mapping of the room 10. This virtual mapping can allow temperature measurements taken in the room 10 by the various temperature sensors 16 to be visually represented by the central computer 1.

Figure 8:
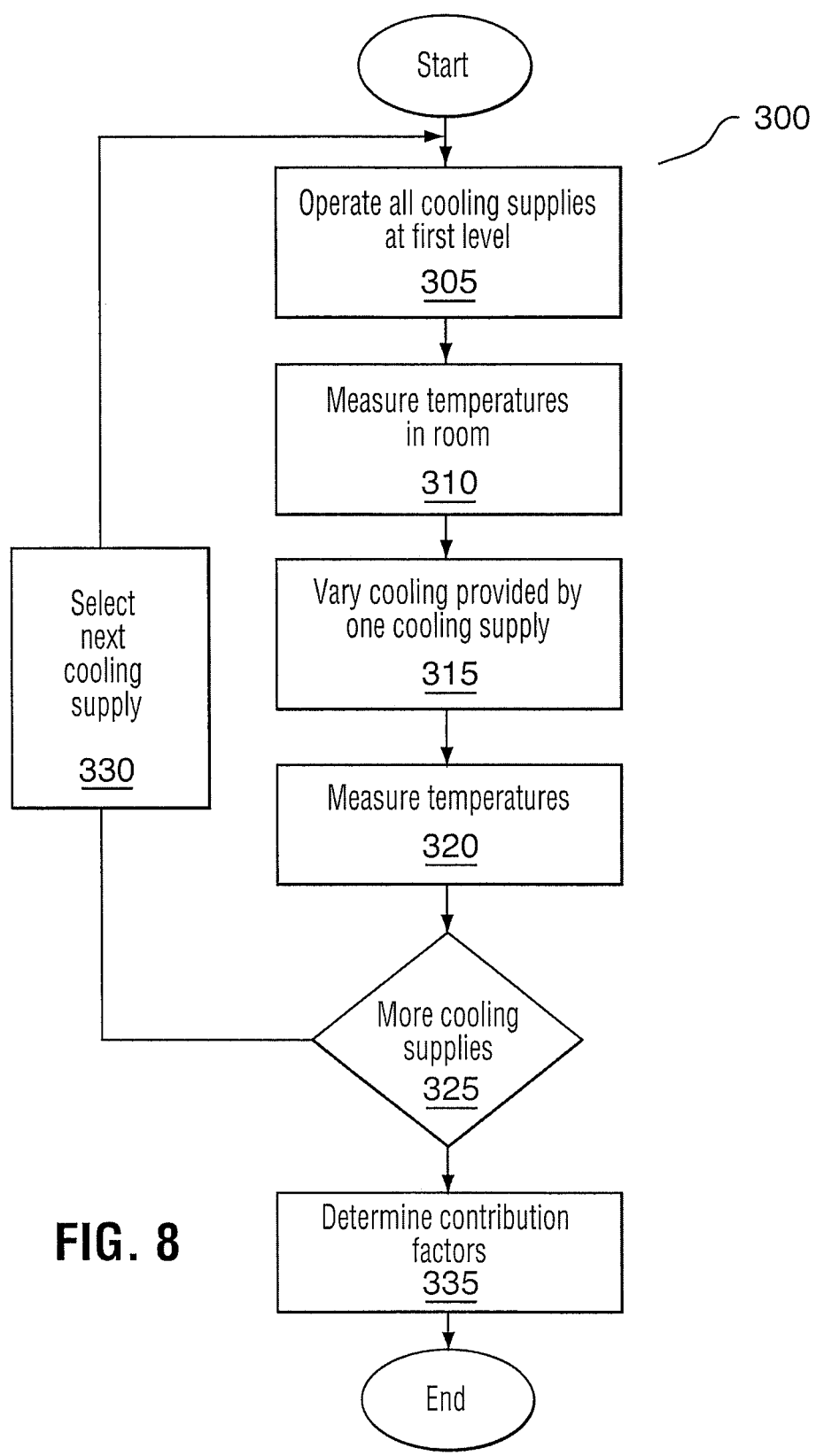
FIG. 8 is a flowchart illustrating a method of determining how a number of cooling supplies affect temperatures of a room.

FIG. 8 is a flow chart illustrating a method 300 that can be performed for determining the effect of a cooling system on a room, such as the cooling system 100 and the room 10 shown in FIG. 1 or the cooling system 200 and the room 110 shown in FIG. 2. The method 300 starts and all of the cooling supplies 50A, 50B, 50C, 50D are set to a first level of operation to deliver a selected amount of cooled air to the room 10 at step 305. In one aspect, each of the cooling supplies 50A, 50B, 50C, 50D can be operated to provide the maximum amount of cooling it can deliver for this first level. For example, if each cooling supply 50A, 50B, 50C, 50D comprises one of the air conditioning units 55A, 55B, 55C, 55D and the air inlets 54A, 54B, 54C, 54D, 54E, 54F operatively connected to the air conditioning unit 55A, 55B, 55C, 55D, as shown in FIG. 1, all of the air conditioning units 55A, 55B, 55C, 55D can be set to be driven at substantially full power (i.e. full fan power and/or full cooling power) with the air inlets 54A, 54B, 54C, 54D, 54E, 54F fully open, to deliver a maximum cooling load to the room 10. However, the air conditioning units 55A, 55B, 55C, 55D could also be driven at a first level that is below their maximum operating output such as at a level of operation that might emulate more regular operation of the air conditioning units 55A, 55B, 55C, 55D.

At step 305, all of the cooling supply 50A, 50B, 50C, 50D are operated at the first level for a first period of time. In one aspect, this first period of time could be the length of time before temperature measurements taken from the room 10 indicated that the room 10 has reached a stabilization of temperature. By stabilization of temperatures, it is intended that the temperature begins to fluctuate around a temperature rather than changing in only one direction (i.e. increasing or decreasing). Alternatively, the cooled air can be supplied for a set period of time, which may vary, but is selected so that the period of time is sufficiently long to provide adequate time for stabilization to occur. For example, a selected period may be at least 30 minutes and may be one day or more. The period of time will be based on various factors, such as cooling capacity of the overall cooling system 100, size of the room 10, etc. Of course, since temperatures may be monitored, a condition may be avoided where the temperature in any region of the room 10 exceeds that temperature above which operation of devices 20 in the room 10 may be compromised.

After the first period of time, the method 300 will move onto step 310 and temperatures in the room 10 are measured. Typically, the temperature sensors 16 are used to take temperature readings in the room 10, so that each temperature sensor 16 will measure the temperature of the room 10 at each point that one of the temperature sensors 16 is located. The temperature measurements taken by the temperature sensors 16 at step 310 can be communicated to the central computer 1.

After temperature reading have been taken at step 310, the method 300 continues to step 315 where the cooling provided by one of the cooling supplies 50A, 50B, 50C, 50D is varied for a second period of time. The cooling provided to the room 10 by the selected cooling supplies 50A, 50B, 50C, 50D can be varied so that it provides less cooling than at step 305, even to the point of providing no cooling to the room 10 (i.e. shutting off the selected cooling supply 50A, 50B, 50C, 50D). For example, the first cooling supply 50A could be shut off while the other cooling supplies 50B, 50C, 50D continue to provide the same amount of cooling that they did in step 305.

At step 315, the output of the selected cooling supply 50A, 50B, 50C, 50D is varied for a second period of time. The second time period could be long enough for the temperature in the room 10 to stabilize or simply a selected period of time that is sufficiently long for the change in the amount of cooling provided by the selected cooling supplies 50A, 50B, 50C, 50D to noticeably affect the temperature of the air in the room 10.

After step 315 is performed for the second time period, the method 300 moves to step 320 and temperature measurements can be taken in the room 10 to determine the affect of varying the cooling supplied by the selected cooling supply 50A, 50B, 50C, 50D. Typically, temperature measurements can be taken with each of the temperature sensors 16 positioned throughout the room 10 to determine the temperature of the room 10 at the different locations where the temperature sensors 16 are positioned. After the cooling provided by the selected cooling supplies 50A, 50B, 50C, 50D has been varied for the second time period, measuring the temperature at various locations throughout the room 10 will result in variations in temperature throughout the room 10 to be observed. Some of the temperature sensors 16 in the room 10 may measure an increase in temperature while other temperature sensors 16 will not measure any change. It is also possible that some of the temperature sensors 16 will measure a decrease in temperature even though the total amount of cooled air being supplied to the room 10 has been reduced. This could be due to another more effective cooling flow being now able to move into an area of the room that was previously affected by a flow or air from one of the other cooling supplies 50A, 50B, 50C, 50D being modified.

From the temperature readings obtained using the temperature sensors 16, it will become apparent as to the influence that the varying of the cooling supplied by the selected cooling supplies 50A, 50B, 50C, 50D will have on temperatures in the room 10. Such influence may be defined as the effect zone of the selected cooling supplies 50A, 50B, 50C, 50D as determined by temperature sensors 16. The temperature measurements can be communicated to the central computer 1 where they can then be stored in the memory of the central computer 1.

With the temperature measurements taken at step 320, the method 300 checks if any more of the cooling supplies 50A, 50B, 50C, 50D remain to be varied at step 325. If more cooling supplies 50A, 50B, 50C, 50D remain to be varied, the method 300 can select the next cooling supplies 50A, 50B, 50C, 50D to be varied at step 330. For example, if cooling supply 50A was previously selected, cooling supply 50B might be selected at step 330. Once the next cooling supply 50B is selected at step 330, the method 300 then returns to step 305, running all of the cooling supplies 50A, 50B, 50C, 50D at a constant rate for the first period of time to bring the temperatures of the room 10 back to a baseline temperature. The method 300 can then move to step 310 and temperature measurements can again be taken using the temperature sensors 16.

At step 315 the output of the next selected cooling supply 50A, 50B, 50C, 50D is varied for the second period of time and then temperature measurements are taken at step 320 using the temperature sensors 16.

By varying the flow of each cooling supply 50A, 50B, 50C, 50D and measuring the result changes in temperature throughout the room 10, the changes in the temperature measurements should indicate how altering the flow of cool air from the next selected cooling supply 50A, 50B, 50C, 50D affects the temperature of the room 10 at the locations of the temperature sensors 16.

The method 300 can continue in this manner for the remaining cooling supplies 50A, 50B, 50C, 50D, altering the flow of cooled air supplied by each of the cooling supplies 50A, 50B, 50C, 50D in turn until all of the cooling supplies 50A, 50B, 50C, 50D have been varied, and approximating the influence zone of each cooling supply 50A, 50B, 50C, 50D in turn. Some of the cooling supplies 50A, 50B, 50C, 50D may have a larger influence zone, than others. This may be due to the nature of heat generating devices in the zone, the power (cooling power, fan drive power, etc.) of cooling supply 50A, 50B, 50C, 50D, blockages along and through venting leading to the inlets 54A, 54B, 54C, 54D, 54E, 54F, and other effects or various of the foregoing in various combinations.

When each cooling supply 50A, 50B, 50C, 50D has been varied and the resulting temperature changes measured, the method 300 can move onto step 335 and the effect of each cooling supply 50A, 50B, 50C, 50D in the room 10 can be approximated. Using the temperature information obtained at steps 315 and 325 of the method 300, a set of contribution factors can be determined. Each contribution factor can be used to relate one of the temperature sensors 16 to one of the cooling supplies 50A, 50B, 50C, 50D. A contribution factor can be determined for each temperature sensor 16 in the room 10 relative to each of the cooling supplies 50A, 50B, 50C, 50D, with the contribution factor indicating what effect each cooling supply 50A, 50B, 50C, 50D has on the temperature sensor 16. For example, for temperature sensors 16 that are positioned at or near where the first cooling supply 50A is introduced into the room 10 the contribution factor for those temperature sensors 16 may indicate that the first cooling supply 50A has a relatively large effect on the temperature of the air surrounding those temperatures sensors 16. For temperature sensors 16 positioned in a location in the room 10 far from the first cooling supply 50A, the contribution factor for that temperature sensor 16 relative to the first cooling supply 50A may indicate that the first cooling supply 50A has little or no effect on the temperature of the air at the temperature sensor 16.

For each temperature sensor 16, a contribution factor could be determined based on the temperature differential that was measured at the temperature sensor 16 when the cooling provided by the cooling supply 50A, 50B, 50C, 50D was varied. In one aspect, these contribution factors could be represented as a percentage contribution of each cooling supply 50A, 50B, 50C, 50D to the temperature measured at the temperature sensor 16. For example in a simple example, if the average temperature change achieved by altering of the cooling provided by each cooling supply 50A, 50B, 50C, 50D is determined, such averages can be used to determine an index based on the percent contribution of each inlet.

With the set of contribution factors determined at step 335, the method 300 can end. After the method 300 has finished, the central computer 1 can have determined and stored a step of contribution factors where each contribution factor indicates how much a cooling supply 50A, 50B, 50C, 50D affects the temperature that has been observed at one of the temperature sensors 16.

Figure 9:
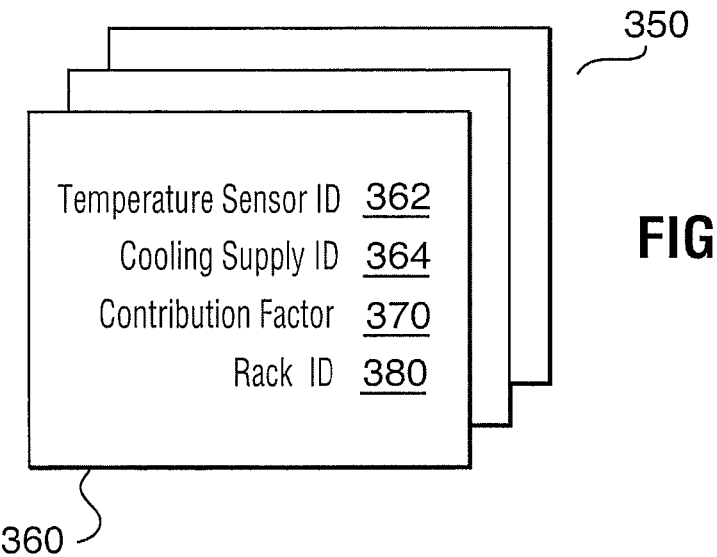
FIG. 9 is a data structure.

These contribution factors can then be stored in the memory 4 of the central computer 1 or some other memory accessible by the central computer 1. In one aspect, the contribution factors could be stored as a table in the memory 4 of the central computer 1, however, FIG. 9 illustrates a possible data structure 350 for storing the contribution factors. Data structure 350 contains a plurality of records 360. Each record 360 may include a temperature sensor identifier field 362, a cooling supply identifier field 364, and a contribution factor field 370. The temperature sensor identifier field 362 can hold a value identifying the temperature sensors 16 that the record is associated with and the cooling supply field 364 can be used to hold a value indicating the cooling supply 50A, 50B, 50C, 50D that the record is associated with. The contribution factor field 370 can be used to hold a value indicating a contribution factor for the temperature sensor 16 indicated in the temperature sensor identifier field 362 relative to the cooling supply 50A, 50B, 50C, 50D indicated in the cooling supply field 364.

In a further aspect, if some or all of the temperature sensors 16 are located on a rack 15, one or more of the records 360 could also contain a rack identifier 380 indicating a rack 15 on which the temperature sensor that is identified in the temperature sensor identifier 362 of the same record 360 is installed. In this manner, the records 360 of the data structure 350 can associate the rack 15 indicated in the rack identifier field 380 with the contribution factor stored in the contributing factor field 370 for the temperature sensor 16 located on the rack relative to the cooling supply 59A, 50B, 50C, 50D indicated in the cooling supply field 364.

Although method 300 was described with reference to the cooling system 100 and the room 10 shown in FIG. 1, a person skilled in the art will appreciate the method 300 could also be used for cooling system 200 shown in FIG. 2 with cooling supplies 50A, 50B, 50C, 50D varied by controlling dampers 160A, 160B, 160C, 160D.

Alternately or in addition, if the room set up is changed, as by installation of new equipment, the foregoing method can be carried out again to verify or selected new cooling power levels for the various inlets/air conditioning units serving in the room.

If it is desired to only determine the effect of one of the modification of cooling power or fan drive apart from the other effect, it may be useful to continue one or the other at substantially full power and modify/alter only one cooling effect at once from a cooling supply 50A, 50B, 50C, 50D. From the temperature readings obtained, it will become apparent as to the influence that the modification in the cooling has on the room 10. Such influence may be defined as the zone of effect as determined by the temperature sensors 16 and can be can be recorded.

Alternatively, the cooling supplies 50A, 50B, 50C, 50D can each be altered by for example fan drives reduced or discontinued, inlet louvers closed fully or partially, and/or cooling power reduced or discontinued, through one inlet, inlet 14A for example, as by cutting power to the air conditioning unit 55A, generating the fan drive and cooled air for the inlet 14A, 14B, 14C, 14D, 14E, 14F.

Alternatively, the contribution factors may be determined by passively monitoring the cooling system 100 over time and determining the contribution factors during the course of normal operation of the cooling system 100. The contribution factors could be determined based on how the temperature measurements change as a result of the operation of the different cooling supplies 50A, 50B, 50C, 50D during normal operation.

Using the contribution factors indicating the effect each cooling supply 50A, 50B, 50C, 50D has on temperatures throughout the room 10, the operation of the cooling supplies 50A, 50B, 50C, 50D can be controlled so that the devices in the room 10 are adequately cooled without over driving any of the cooling supplies 50A, 50B, 50C, 50D and expending unnecessary energy. Using the contribution factors, the effect of each cooling supply 50A, 50B, 50C, 50D at each temperature sensor 16 in the room can be known and the operation of the cooling supplies 50A, 50B, 50C, 50D controlled based on the contribution factors to supply cooling to any specific temperature sensor 16 in the room 10. Rather than simply running the cooling supplies 50A, 50B, 50C, 50D until a desired temperature is achieved at a specific location in the room or trying to select one of the cooling supplies 50A, 50B, 50C, 50D based on attempting to predictively model the effects of the cooling supplies 50A, 50B, 50C, 50D using calculations and assumptions, the contribution factors allow a cooling supply 50A, 50B, 50C, 50D to be selected based on its actual measured effects. Such ability to control the cooling system 100 can allow it to operate in a more energy efficient manner with cooling power being focused in areas where it is most needed and cooling power reduced in areas where further cooling is not required.

The contribution factors can be used to control the operation of the various cooling supplies 50A, 50B, 50C, 50D in the cooling system 100 to try and improve the efficiency of the cooling system 100. The contribution factors can be used to determine which cooling supplies 50A, 50B, 50C, 50D have lower overall contributions such that the power to drive them can be reduced. For example, the cooling supplies 50A, 50B, 50C, 50D can each be set to provide a selected level of cooling that corresponds with their contribution, as determined by the foregoing. The first cooling supply 50A may be driven to provide a cooling power of only 20% of its maximum power output, if it was determined that its contribution to the room 10 cooling is only 20% of the total room 10. Additionally, hot spots (i.e. areas where one or more devices in the room 10 generate more heat than other devices in other parts of the room 10) can be more efficiently addressed by increasing the contribution to the cooling of the room 10 by the controlling the cooling supplies 50A, 50B, 50C, 50D that have a greater effect on the portion of the room 10 where the hot spot is located.

By providing the temperature sensors 16 in a permanent-type installation and possibly operably in communication with the central computer 1, they are available for regular monitoring of the room 10 air conditioning. For example, the temperature sensors 16 can be monitored periodically to cause the cooling supplies 50A, 50B, 50C, 50D to be adjusted to accommodate changes in the room 10. After the air conditioning system 100 is set up to drive the cooling supplies 50A, 50B, 50C, 50D, temperature sensors 16 may be monitored to determine if the selected cooling supplies 50A, 50B, 50C, 50D are cooling the room 10 adequately, such as providing too little or too much cooling at different locations in the room 10.

Such a system may also be useful to respond to temporary changes in temperature in the room 10 by automatically monitoring the temperature sensors 16 and feeding back a control to the air conditioning system 100 to adjust the volume and/or temperature of flow through one or more of the cooling supplies 50A, 50B, 50C, 50D to bring the room 10 into an acceptable temperature range. This may for example be useful when some devices in the room 10 are being run at greater than normal levels, when one or more devices or their cooling systems are failing or when an air conditioning unit is failing.

Figure 10:
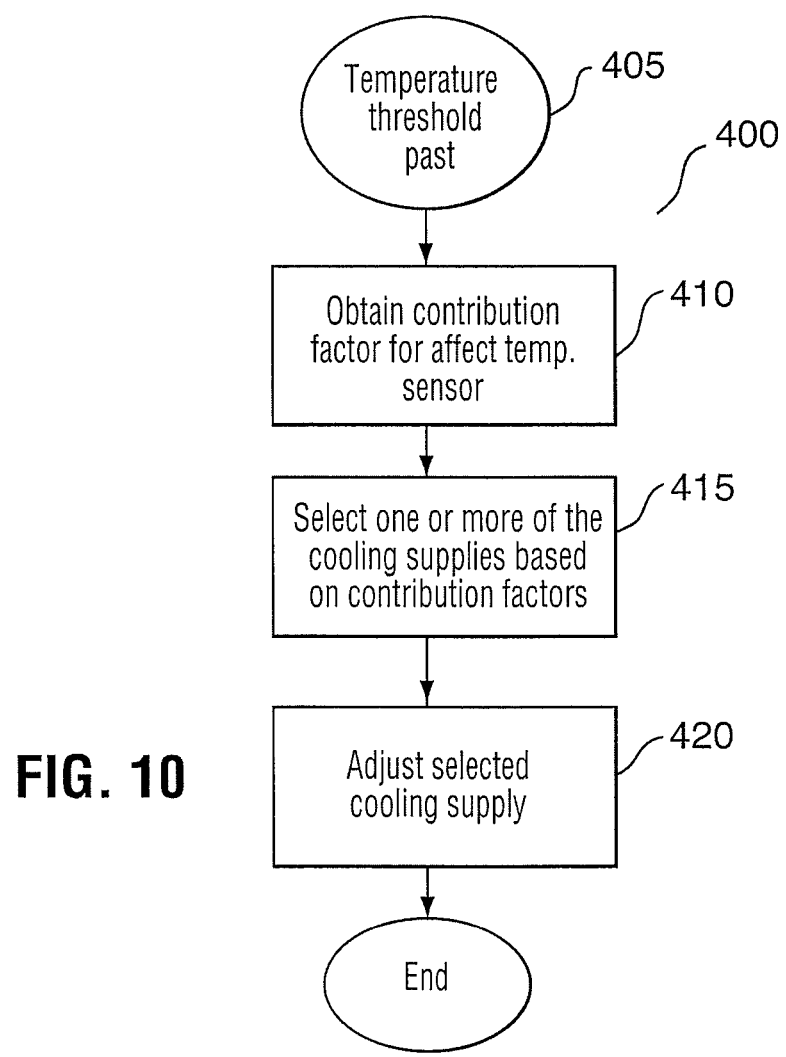
FIG. 10 is a flowchart illustrating a method of controller a cooling system.

With contribution factors obtained for the cooling system 100, such as by using the method 300 illustrated in FIG. 8 or passively monitoring the room 10 over time and determining the contribution factors, the cooling system 100 can then be configured to automatically react to measured temperature changes by one of the temperature sensors 16. FIG. 10 is a flowchart illustrating a method 400 for altering the output of the cooling system 100 in response to one or more of the temperature sensors 16 measuring a temperature beyond a threshold level.

Method 400 begins at step 405 with one or more of the temperature sensors 16 measuring a temperature deviation beyond a temperature threshold. The temperature deviation is typically a temperature measurement that is greater than the desired temperature range. However, in some cases, the temperature deviation may indicate that a temperature sensor 16 is measuring a temperature that is cooler than a desired temperature range which could indicate that devices in the room 10 are being overcooled and that the cooling system 100 is expending unnecessary energy providing unnecessary cooling.

With at least one of the temperature sensors 16 measuring a temperature deviation, the central computer 1 can then obtain the contribution factors associated with the one or more temperature sensor 16 measuring the temperature deviation at step 410.

With the contribution factors indicating how much each of the cooling supplies 50A, 50B, 50C, 50D affect the air in the room 10 surrounding the temperature sensors 16 that are measuring the temperature deviation, the contribution factors can be used to select one or more of the cooling supplies 50A, 50B, 50C, 50D at step 415.

In one aspect, the contribution factors for a temperature sensor 16 measuring a temperature deviation could be analyzed and the cooling supply 50A, 50B, 50C, 50D that contributes the most to the temperature of the air where the temperature sensor 16 is located could be selected. In a further aspect, if more than one temperature sensor 16 measures a deviation beyond the temperature threshold, the differential between the measured temperature of each temperature sensor 16 over the threshold temperature could be used with the contribution factors to select one or more of the cooling supplies 50A, 50B, 50C, 50D. In this manner, the temperature sensors 16 reading the greatest temperature change can be weighted by having the contribution factors associated with those temperature sensors 16 taken into more account than the contribution factors of those temperature sensors 16 measuring a smaller temperature deviation from the temperature threshold.

Using the one or more cooling supplies 50A, 50B, 50C, 50D selected at step 415, the selected one or more cooling supplies 50A, 50B, 50C, 50D could be adjusted at step 420. The selected one or more cooling supplies 50A, 50B, 50C, 50D could be adjusted by turning it on or the amount of cool air provided by the cooling supply 50A, 50B, 50C, 50D could be increased to reduce the temperature in the room 10 at the location where the temperature sensors 16 are reading the temperature deviation.

In this manner, the central computer 1 can use the contribution factors to determine which cooling supplies 50A, 50B, 50C, 50D will have the greatest effect on the temperature of the room 10 at the locations of the temperature sensors 16 measuring the elevated temperatures. By using the contribution factors, the central computer 1 can choose one or more of the cooling supplies 50A, 50B, 50C, 50D to cool the temperature of the air at the temperature sensors 16 recording the elevated temperature. In this manner, the central computer 1 can potentially reduce the amount of cooling required by selecting one or more of the cooling supplies 50A, 50B, 50C, 50D that will have the most effect on the portion of the room 10 that needs the cooling, instead of selecting one or more of the cooling supplies 50A, 50B, 50C, 50D that may be overdriven and expend unnecessary additional energy trying to decrease the temperature in a portion of the room 10 it has less effect on than one of the other cooling supplies 50A, 50B, 50C, 50D. Additionally, by running the configuration method 300 shown in FIG. 8, the central computer 1 does not have to have knowledge of where the temperature sensors 16 are located within the room 10 (although it could), but rather can use the determined contribution factors to determine the effects of the different cooling supplies 50A, 50B, 50C, 50D on the locations in the room where temperature sensors 16 are provided.

The previous description of the disclosed embodiments is provided to enable any person skilled in the art to make or use the present invention. Various modifications to those embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the full scope consistent with the claims, wherein reference to an element in the singular, such as by use of the article "a" or "an" is not intended to mean "one and only one" unless specifically so stated, but rather "one or more". All structural and functional equivalents to the elements of the various embodiments described throughout the disclosure that are known or later come to be known to those of ordinary skill in the art are intended to be encompassed by the elements of the claims. Moreover, nothing disclosed herein is intended to be dedicated to the public regardless of whether such disclosure is explicitly recited in the claims.

The invention claimed is:

1. A system for generating a virtual mapping of a room containing a plurality of computer servers, the system comprising:

a plurality of racks for housing servers;

a plurality of position determining devices, each respective position determining device operative to evaluate a signal and to obtain position information, wherein each respective position determining device is positioned on a corresponding one of the plurality of racks;

a plurality of temperature sensors, each temperature sensor associated with one of the position determining devices; and, at least one computer operatively connected to the plurality of position determining devices to receive position information from the position determining devices and operatively connected to the plurality of temperature sensors to receive temperature measurements from the plurality of temperature sensors, the at least one computer operative to create a virtual mapping of the room indicating the approximate positions of the plurality of temperature sensors in the room based on the position information received from the position determining devices, and to store a contribution factor corresponding to an effect a cooling supply has on at least one of the temperature sensors.

2. The system of claim 1 wherein the plurality of position determining devices are signal receivers.

3. The system of claim 2 wherein the plurality of position determining devices are GPS receivers.

4. The system of claim 1 wherein the at least one computer is further operative to provide a visual representation of the room based in part on the position information received from the plurality of position determining devices positioned on the plurality of racks and, based in part on the virtual mapping of the room, to indicate the approximate position where a temperature measurement was taken in the room.

5. The system of claim 1 further comprising a plurality of control systems, each control system associated with one of the plurality of racks and operatively connected to the position determining device and at least one temperature sensor associated with the one of the plurality of racks, the control system operatively connected to the at least one computer.

6. The system of claim 1 wherein at least one of the plurality of racks has standardized dimensions and the position determining device associated with the at least one of the plurality of racks is positioned in the at least one rack in a standardized position defined in relation to selected dimensions of the rack.

7. The system of claim 4 wherein for the at least one of the plurality of the racks, the at least one temperature sensors associated with the at least one of the plurality of racks is spaced a standardized distance from the position determining device associated with the at least one of the plurality of racks and the at least one computer is further operative to use the standardized distance to the position determining device associated with the at least one of the plurality of racks and the position information obtained from the position determining device associated with the at least one of the plurality of racks to plot the approximate positions of the at least one temperature sensor associated with the at least one of the plurality of the racks in the virtual mapping of the room.

8. The system of claim 1 wherein the computer is further configured to obtain temperature measurements from the plurality of temperature sensors and visually indicate the positions in the room where the temperature sensors have taken the temperature measurements using the virtual mapping of the room.

9. The system of claim 1 wherein the at least one computer is operatively connected to a cooling system for cooling the room.

10. The system of claim 9 wherein the at least one computer comprises a memory which stores one or more contribution factors corresponding to at least one of (a) a temperature measured by the plurality of temperature sensors, (b) a rate of cooling provided by one or more cooling supplies, (c) a power provided to one or more fans, (d) an air conditioning setting, (e) a heat load to be cooled, (f) the number in the plurality of racks, and (g) a cooling capacity of the cooling system, and wherein the computer controls an operation of the cooling system based at least in part on the one or more contribution factors stored in the memory.

11. A rack for holding at least one computer server, the rack comprising:
   a frame for supporting the at least one server;
   a control system provided on the rack and connectable to a computer, the control system operative to transfer information to the computer;
   a position determining device mounted to the rack and operatively connected to the control system, the position determining device operative to obtain position information corresponding to a position of the rack based at least in part on a signal strength and to communicate the position information to the control system; and
   at least one temperature sensor provided on the rack and operative to take a temperature measurement and communicate the temperature measurement to the control system, wherein the control system is operative in relation to a contribution factor corresponding to an effect a selected cooling system has on the at least one temperature sensor.

12. The rack of claim 11 wherein the position determining device is positioned at a standardized position in the rack.

13. The rack of claim 12 wherein the at least one temperature sensor is spaced a standardized distance from the position determining device so that position information obtained using the position determining device can be used to determine the approximate position of the at least one temperature sensor.

14. The rack of claim 13 wherein the plurality of position determining devices are signal receivers.

15. The rack of claim 14 wherein the plurality of position determining devices are GPS receivers.

16. A method for generating a virtual mapping of a room indicating approximate positions of a plurality of temperature sensors in the room, the method comprising:
   for each of the temperature sensors, automatically obtaining position information associated with the temperature sensor;
   generating the virtual mapping by, for each of the plurality of temperature sensors, using the position information associated with the temperature sensor to plot the position of the temperature sensor in the virtual mapping; and
   using the virtual mapping to compute a contribution factor corresponding to an influence a selected cooling system has on a measured temperature at a location in the room where a temperature measurement was taken by one of the plurality of temperature sensors;
   wherein the position information is automatically obtained from a position determining device affixed to a server rack in a fixed positioned relative to at least one temperature sensor mounted to the rack, wherein the act of automatically obtaining position information comprises evaluating a signal strength to approximate a distance of the position determining device from a signal source and/or triangulating multiple signals.

17. The method of claim 16 wherein for each position determining device, the at least one temperature sensor associated with position determining device is positioned a standardized distance from the position determining device and the virtual map is generated by using the position information obtained from the position determining device and the standardized distance of the at least one temperature sensor from the position determining device to plot the approximate position of the at least one temperature sensor associated with the position determining device in the virtual mapping of the room.

18. The method of claim 17 wherein the position determining devices are GPS receivers.

19. The method of claim 16 further comprising using a reference measurement to plot features of the room in the virtual mapping.

* * * * *